(12) United States Patent
Champagne et al.

(10) Patent No.: US 9,533,223 B2
(45) Date of Patent: *Jan. 3, 2017

(54) GAME OBJECT CONTROL USING POINTING INPUTS TO ROTATE A DISPLAYED VIRTUAL OBJECT CONTROL DEVICE

(71) Applicant: Nintendo Co., Ltd., Kyoto (JP)

(72) Inventors: Robert Champagne, Redmond, WA (US); Shigeki Yamashiro, Redmond, WA (US); Shigeru Miyamoto, Kyoto (JP); Claude Comair, Vancouver (CA)

(73) Assignee: NINTENDO CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/793,953

(22) Filed: Jul. 8, 2015

(65) Prior Publication Data
US 2015/0306506 A1    Oct. 29, 2015

Related U.S. Application Data

(63) Continuation of application No. 14/010,140, filed on Aug. 26, 2013, now Pat. No. 9,101,827, which is a
(Continued)

(51) Int. Cl.
| | | |
|---|---|---|
| A63F 13/00 | (2014.01) | |
| A63F 13/42 | (2014.01) | |
| G09B 9/04 | (2006.01) | |
| A63F 13/2145 | (2014.01) | |
| A63F 13/245 | (2014.01) | |
| A63F 13/285 | (2014.01) | |
| A63F 13/803 | (2014.01) | |
| A63F 13/98 | (2014.01) | |
| G06F 3/01 | (2006.01) | |
| G06F 3/0488 | (2013.01) | |
| G06F 17/50 | (2006.01) | |

(52) U.S. Cl.
CPC .............. *A63F 13/42* (2014.09); *A63F 13/00* (2013.01); *A63F 13/2145* (2014.09); *A63F 13/245* (2014.09); *A63F 13/285* (2014.09); *A63F 13/803* (2014.09); *A63F 13/98* (2014.09); *G06F 3/016* (2013.01); *G06F 3/0488* (2013.01); *G06F 17/5009* (2013.01); *G09B 9/04* (2013.01); *A63F 2300/204* (2013.01); *A63F 2300/301* (2013.01); *A63F 2300/6045* (2013.01); *A63F 2300/8017* (2013.01)

(58) Field of Classification Search
None
See application file for complete search history.

(56) References Cited

U.S. PATENT DOCUMENTS

| | | |
|---|---|---|
| 5,490,783 A | 2/1996 | Stephens et al. |
| 6,010,403 A * | 1/2000 | Adam et al. ............ 463/6 |

(Continued)

*Primary Examiner* — Masud Ahmed
(74) *Attorney, Agent, or Firm* — Nixon & Vanderhye P.C.

(57) ABSTRACT

A vehicle simulation such as for example a driving game can be provided by displaying an image of a steering wheel on a touch sensitive screen. Touch inputs are used to control the rotational orientation of displayed steering wheel. The rotational orientation of the displayed steering wheel is used to apply course correction effects to a simulated vehicle. Selective application of driver assist and different scaling of touch inputs may be provided.

15 Claims, 11 Drawing Sheets

Related U.S. Application Data continuation of application No. 13/476,740, filed on May 21, 2012, now Pat. No. 8,540,573, which is a continuation of application No. 12/606,482, filed on Oct. 27, 2009, now Pat. No. 8,202,163, which is a continuation of application No. 11/243,183, filed on Oct. 5, 2005, now Pat. No. 7,625,287.

(56) References Cited

U.S. PATENT DOCUMENTS

| | | |
|---|---|---|
| 6,424,334 B1 | 7/2002 | Zimmerman et al. |
| 6,597,347 B1 * | 7/2003 | Yasutake |
| 6,720,949 B1 * | 4/2004 | Pryor et al. ............... 345/158 |
| 7,042,440 B2 * | 5/2006 | Pryor et al. ............... 345/158 |
| 2001/0008841 A1 | 7/2001 | Komata |
| 2002/0097229 A1 | 7/2002 | Rose et al. |
| 2004/0058730 A1 | 3/2004 | Ouchi |
| 2006/0211466 A1 * | 9/2006 | Ward et al. ............... 463/16 |
| 2007/0032280 A1 * | 2/2007 | Itskov et al. ............... 463/7 |

* cited by examiner

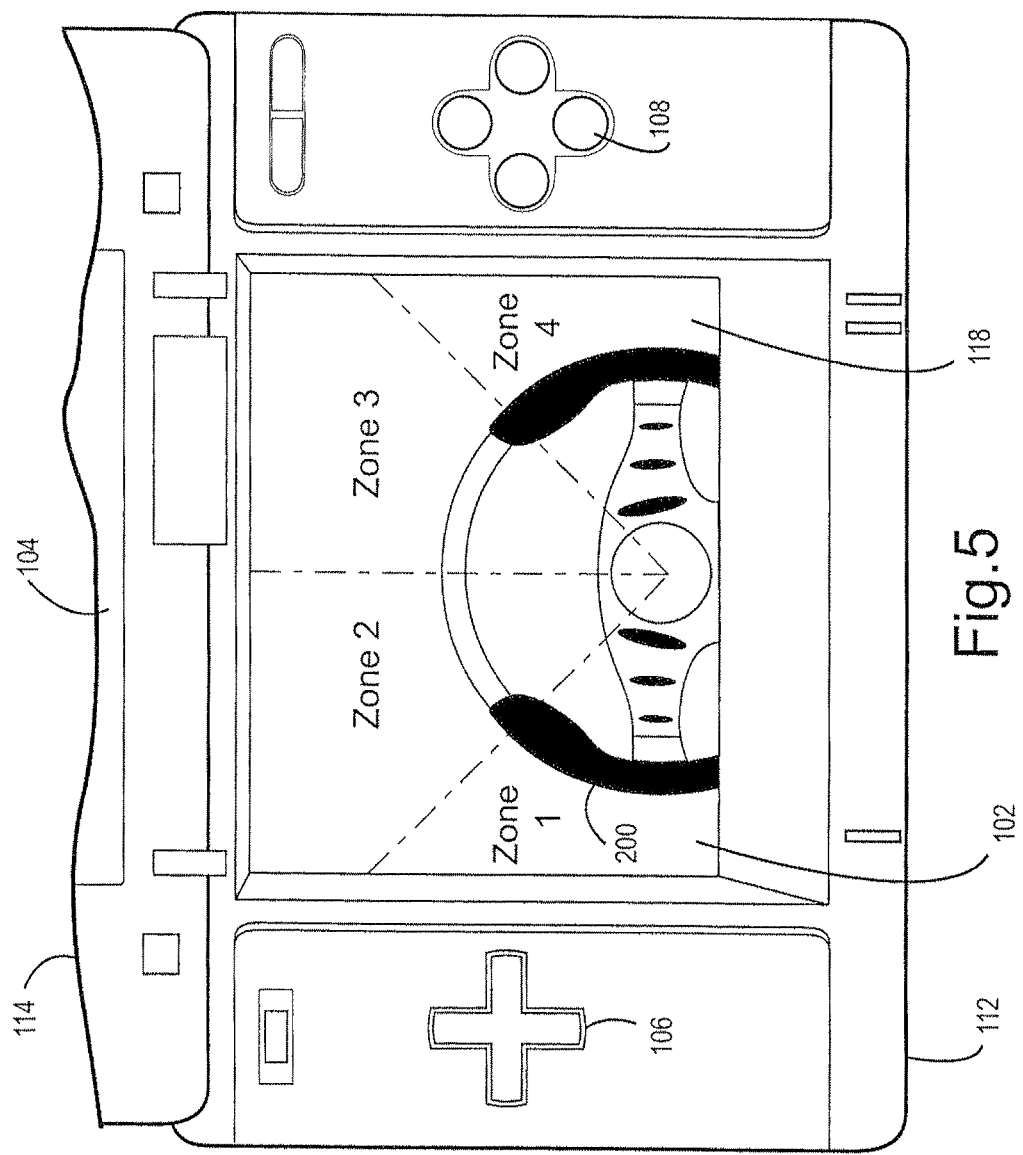

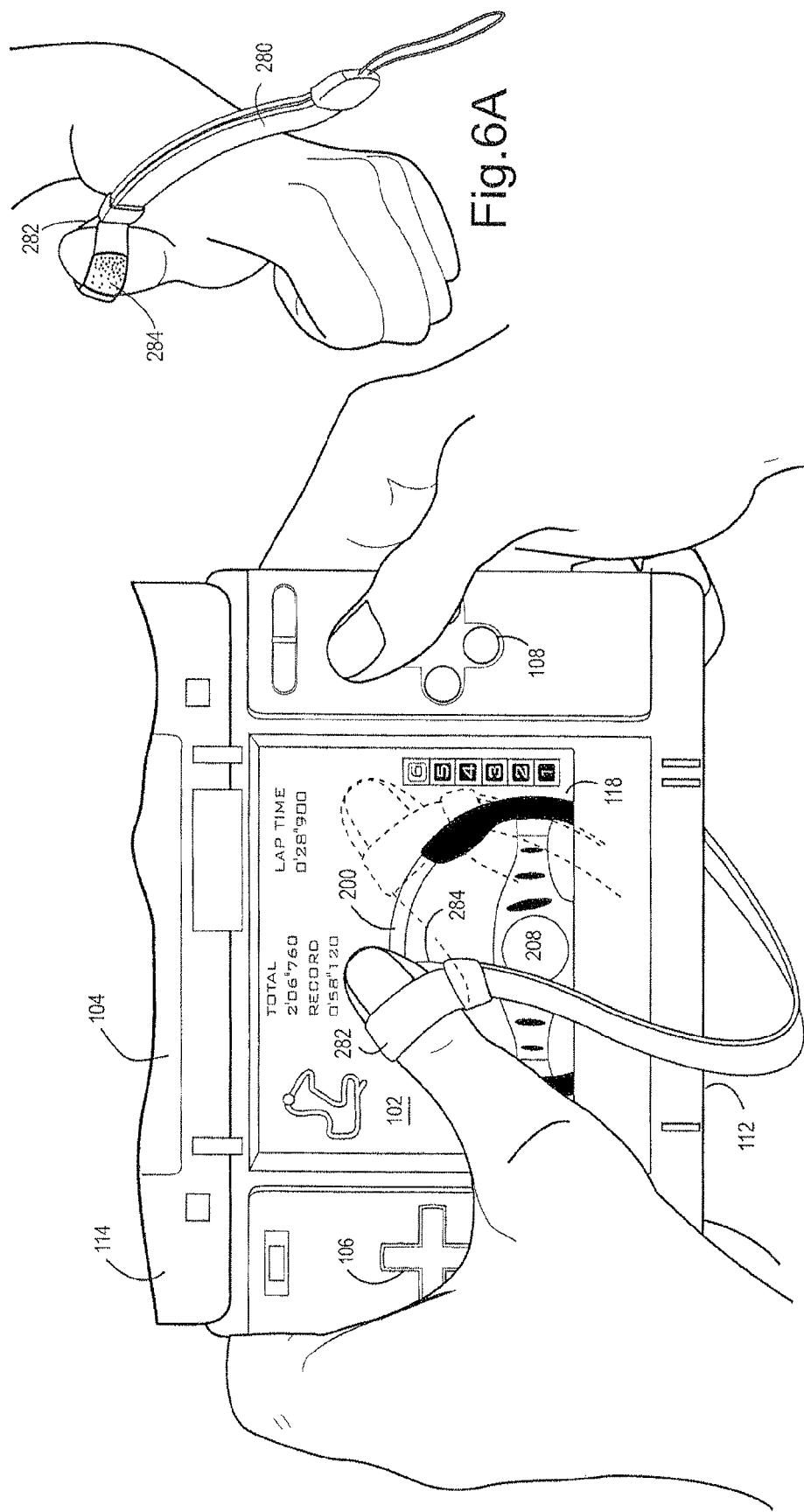

GAME OBJECT CONTROL USING POINTING INPUTS TO ROTATE A DISPLAYED VIRTUAL OBJECT CONTROL DEVICE

CROSS-REFERENCE TO RELATED APPLICATIONS

This application is a continuation of U.S. patent application Ser. No. 14/010,140 filed Aug. 26, 2013; which is a continuation of U.S. patent application Ser. No. 13/476,740 filed May 21, 2012, now U.S. Pat. No. 8,540,573; which is a continuation of U.S. patent application Ser. No. 12/606,482 filed Oct. 27, 2009, now U.S. Pat. No. 8,202,163; which is a continuation of U.S. patent application Ser. No. 11/243,183 filed Oct. 5, 2005, now U.S. Pat. No. 7,625,287. The disclosures of the prior applications are incorporated herein by reference.

FIELD

The technology herein relates to vehicle simulations and driving video games. In more detail, the technology herein relates to simulating control of a vehicle such as for example a race car or other vehicle by controlling the path of the vehicle using a touch screen.

BACKGROUND AND SUMMARY

Some of the most exciting simulations and video games are those in which the game player or other operator controls a simulated vehicle. Flight simulators that simulate an airplane or jet, driving games that simulate a race car, boat or jet ski games that simulate water craft, and space games that simulate space craft are examples of virtual experiences that have supplied endless fascination and challenges.

More sophisticated driving or vehicle simulations simulate the physics of the vehicle as it travels, providing a very realistic interactive experience. Such simulations can be so realistic that pilots, astronauts or other vehicle operators sometimes use simulators to train for operating real vehicles. Video game developers also often seek to make their vehicle simulation games as realistic as possible.

One of the challenges of providing realistic vehicle simulation relates to the control interface a game player or other operator uses to operate the simulated vehicle. On expensive flight simulators and spacecraft simulators of the type used to train pilots or astronauts, it is possible to provide a model vehicle cockpit including real joysticks, steering wheels, gauges and other instrumentation and controls that are the same as the controls within actual vehicles. Driving simulators of the type used to train new drivers to operate motor vehicles can similarly provide full-sized steering wheels, gas and brake pedals, turn signal controls and the like to provide a very close simulation of actual vehicle operation. Some of the more realistic arcade video games similarly provide full-sized joy sticks, steering wheels, and gas and brake pedals so that the game player feels as if he or she is operating an actual vehicle.

Unfortunately, such realistic input devices can be very expensive to manufacture and are quite large and bulky. In the context of home video game play, it is possible to purchase equipment accessory driving game user interfaces including steering wheels and the like for use in controlling driving games on home video game platforms and/or personal computers. However, such peripheral input devices are expensive and many video game players cannot justify the cost—especially if they play a variety of games only some of which are driving games.

Another approach that video game designers have turned to is using the existing more general purpose input devices available on a home video game platform or personal computer to provide realistic and flexible control of a vehicle simulation. Since many home video game platforms are now equipped with one or multiple joysticks, it is perhaps straightforward to provide a realistic joystick-like control of an aircraft or spacecraft simulation using the existing control interface. Similarly, control of a simulated watercraft such as a jet ski or small outboard motor boat can be readily simulated using a joystick (usually in addition with other controls) as a control interface. However, there is no ready way to simulate a steering wheel using a joystick. In fact, the ergonomics of a steering wheel are somewhat different from those of a joystick.

Consider, for example, the relative ease by which it is possible to steer a car or boat using a steering wheel. A steering wheel provides grips for both hands but can be operated with a single hand if desired. It is possible through a simple movement of the arms to turn the steering wheel in either rotational direction (clockwise or counter clockwise) to control the direction the vehicle is traveling. Even a relatively slight rotation of the steering wheel can cause a major, rapid response in the movement of the vehicle. One can immediately tell by looking at the position of the steering wheel how much the vehicle steering mechanism (e.g., front wheel position for a car or truck, rudder for a boat) is deflected to cause a change in vehicle course. Rapid motion of the steering wheel from a neutral position to a corrective steering position and back to the neutral position can provide almost immediate response in vehicle course change. The amount by which the steering wheel is rotated can directly correspond to the amount the vehicle course control mechanism deflects or otherwise acts in order to change vehicle course. In view of these simple and effective ergonomics, it is no accident that steering wheels are standard control mechanisms for many vehicles of all different types throughout the world.

Consider now the challenge involved in attempting to simulate the operation of a steering wheel using other control inputs such as for example, a joystick, trackball or mouse pointing device. Like a steering wheel, these devices (in at least some of their forms) can provide a variable amount of control as opposed to simply on/off control. For example, an analog joystick can provide a range of active control inputs so that the amount of joystick deflection can correspond to the amount of vehicle course correction, and the direction of joystick deflection can correspond to the direction of vehicle course correction. Similarly, one can immediately see by looking at the position of a joystick or a mouse how much course correction is being applied and the direction of such course correction. Yet, while the correspondence between a joystick and a steering wheel is quite close in some respects, it is not sufficiently close that one finds many automobiles controlled by joysticks rather than steering wheels. For example, most joysticks provide two degrees of freedom (forward/backward and left/right) that does not correspond at all to the more constrained clockwise/counterclockwise rotation of a steering wheel. Some experimental cars have used joysticks instead of steering wheels, but one does not find joysticks replacing steering wheels on standard passenger automobiles.

An even greater challenge is presented when one attempts to simulate realistic vehicle control inputs using a game playing platform that does not provide the continuous motion of a joystick, trackball or mouse. Due to size, cost and related issues, many popular handheld video game playing platforms (including for example dedicated video game players, cellular telephones, PDAs and the like) may have no continuous or analog control input devices such as joysticks, trackballs, mice or the like, or any continuous or analog control input devices may be quite different in configuration. In some such platforms, it has been necessary in the past to control the course of a simulated vehicle using discrete key closures of momentary-on push button controls. Resulting games have been successful, but one cannot say that the control input functionality completely realistically simulates the control input of an actual vehicle steering wheel. Therefore, further improvements are desirable.

Some recent portable handheld video game platforms including for example the Nintendo DS are provided with touch sensitive screens. In the abstract, it would seem to be desirable to make use of such touch sensitive screens to provide more realistic control input simulations for driving games and other applications. However, it is not immediately apparent how the developer of a video game or other application might use or take advantage of a touch screen to provide a realistic vehicle control input function. In particular, a touch screen typically senses a position of a finger or stylus disposed at a single point on the screen. Moving the finger or stylus back and forth or over the touch screen does not necessarily have the same intuitive feel as rotating a steering wheel in different directions. To the contrary, the linear movement of a finger or stylus on a flat surface seems at first appearance to have no real intuitive ergonomic relationship with gripping and rotating a steering wheel.

The technology herein provides, in exemplary illustrative non-limiting implementations, unique and non-obvious techniques for using a relatively limited repertoire of input controls to provide realistic, exciting and accurate simulations of steering wheel operated (and other) vehicles or other moving objects.

In one exemplary illustrative non-limiting implementation, a video game or other application displays an image of a steering wheel. Such display may be on the same screen as one that displays other information such as a race course or other environment through which the vehicle may be maneuvered in a simulated fashion, or it may be on a different screen. The steering wheel display is, in one exemplary illustrative non-limiting implementation, displayed on a screen that is touch sensitive. The touch-sensitive functionality of the screen is used in at least some exemplary illustrative non-limiting implementations to allow the video game player to control the position of the steering wheel displayed on the screen. The displayed vehicle steering wheel position, in turn, is used to control the travel motion or direction of the vehicle being simulated. The resulting simulation provides a realistic input control interface obtainable using relatively inexpensive and compact input devices such as those available on conventional portable or other video game play and/or simulation platforms.

One exemplary illustrative non-limiting implementation draws a graphic of a steering-wheel on an LCD display screen. The input from a stylus or other pointer is used to determine a vector from the center of the steering-wheel to the point being touched on the LCD display. The angle between any two consecutive vectors is used to determine the direction and amount of rotation of the displayed steering-wheel.

While the input from the steering-wheel itself is sufficient to simulate, for example, the driving of an automobile, the input may be further analyzed to make the simulated vehicle more controllable for the user. For example, in some exemplary illustrative non-limiting implementations, specific zones are defined (e.g., centered around the wheel at approximately 45-degrees from center in either direction). The user input is constantly compared to these zones to determine exactly how "frantic" the user is responding to the current position and orientation of the simulated vehicle. This allows the simulation to actually "take-over" (for short periods of time) when it deems it appropriate to keep the vehicle centered on the road or other course.

As the simulation progresses, the user is given visual-feedback (e.g., via translation and scaling of the steering-wheel graphic) about the current environment that the vehicle is experiencing. This may include collisions with other cars or static objects, rough-road, etc. This feedback allows the user to have a much more vivid experience in the simulation than merely seeing other vehicles or objects close to his or her vehicle.

In more detail, one exemplary illustrative non-limiting operating mode uses momentary-on key closures to control the course of a simulated vehicle. For example, depressing one pushbutton switch causes the vehicle to steer to the left, while depressing another pushbutton causes the vehicle to steer to the right. In response to such depressions, a model of a vehicle steering wheel displayed on a screen rotates to the left or to the right respectively to provide a visual indication to the game player as to how much the game player is correcting the course of the simulated vehicle. In such exemplary control interfaces, for example, depressing a button for a short period of time may be seen on the screen to cause only a slight rotation of the displayed steering wheel, while depressing the control button for a longer period of time causes more rotation of the displayed steering wheel. In some exemplary illustrative control interfaces, operation could be accomplished with only a single finger or thumb by operating a cross switch or other similar control.

Exemplary illustrative non-limiting implementations can provide additional or different steering wheel control simulations that take advantage of the touch screen functionality. For example, one exemplary illustrative non-limiting implementation makes use of a stylus or other touch screen pointer to control deflection or rotation of the simulated steering wheel to thereby simulate control of the vehicle. It is possible, for example, to place the stylus or other pointer in registry with the image of the simulated steering wheel displayed on the touch screen. Rotating the steering wheel may be accomplished by linear movement of the stylus on the touch screen. For example, moving the stylus linearly from the center of the display to the left of the display may cause the steering wheel to rotate counter clockwise, whereas moving the stylus to the right linearly may cause the simulated steering wheel to rotate clockwise. The amount of linear movement (e.g., the relative position of the stylus relative to an imaginary vertical center of the touch screen or other reference point) may control the amount of clockwise or counter clockwise rotation of the steering wheel.

In such exemplary illustrative non-limiting implementations, the game player is offered quite a bit of flexibility to control the simulated steering wheel as he or she sees fit or as is most natural. Some game players may find it to be quite intuitive to keep the stylus or finger positioned over a part of the steering wheel and to use it as simulated handgrip to directly cause the steering wheel to turn in one direction or another. Other game players, in contrast, may find it to be more intuitive to move the stylus with a finger in ways that do not appear to be directly in contact with the displayed steering wheel but which nevertheless directly exert "virtual" ("the unseen hand") control over the simulated clockwise or counter clockwise movement of the displayed steering wheel on the screen.

As explained above, in this exemplary illustrative implementation, the angle between two consecutive vectors defined by successive stylus stopping points and the displayed steering wheel center can be used to control the amount of steering wheel rotation, and the direction of the change in stylus position can be used to control the direction of steering wheel rotation. Furthermore, display of the steering wheel is not even necessary to effect such control—similar steering functionality can be provided in other exemplary illustrative implementations when a steering wheel display is suppressed or otherwise not present.

In further exemplary illustrative non-limiting implementations, a stylus or finger control may be replaced by a thumb strap or other actuator that is in effect "worn" by the game player. In such exemplary illustrative non-limiting implementations, the portable game player may be equipped with a wrist strap including a small touch screen actuator that may be attached to and worn by a game player on a digit such as a thumb or a finger. Placing the actuator in contact with the touch screen may allow the game player to control the rotational position of the simulated steering wheel—with our without the vector control described above. Different scaling factors can be applied to stylus and thumb-mounted actuators to provide more comfortable user ergonomics.

Further exemplary illustrative implementations provide a "smart" or "intelligent" user assist that senses different types of user control input actuations and "helps" the user when appropriate while forbearing from such "helping" when not appropriate.

Still further exemplary illustrative non-limiting implementations substitute a different visual (e.g., a zone pattern such as the top half of an archery target) for the steering wheel display. The user may use such a visual to guide him or her in positioning a touch input. Different zones may correspond to different input control scales to indicate how much control is exerted on the simulated vehicle or other object for a given amount to touch input position change.

BRIEF DESCRIPTION OF THE DRAWINGS

These and other features and advantages will be better and more completely understood by referring to the following detailed description of exemplary non-limiting illustrative embodiments in conjunction with the drawings of which:

FIG. 5 shows exemplary illustrative non-limiting control input zones selectively providing user assist and non-assist regions;

FIG. 6 shows exemplary user input control using a wearable thumb-mounted touch actuator;

FIG. 6A shows a more detailed view of an exemplary wearable thumb-mounted touch actuator;

DETAILED DESCRIPTION

Figure 1:
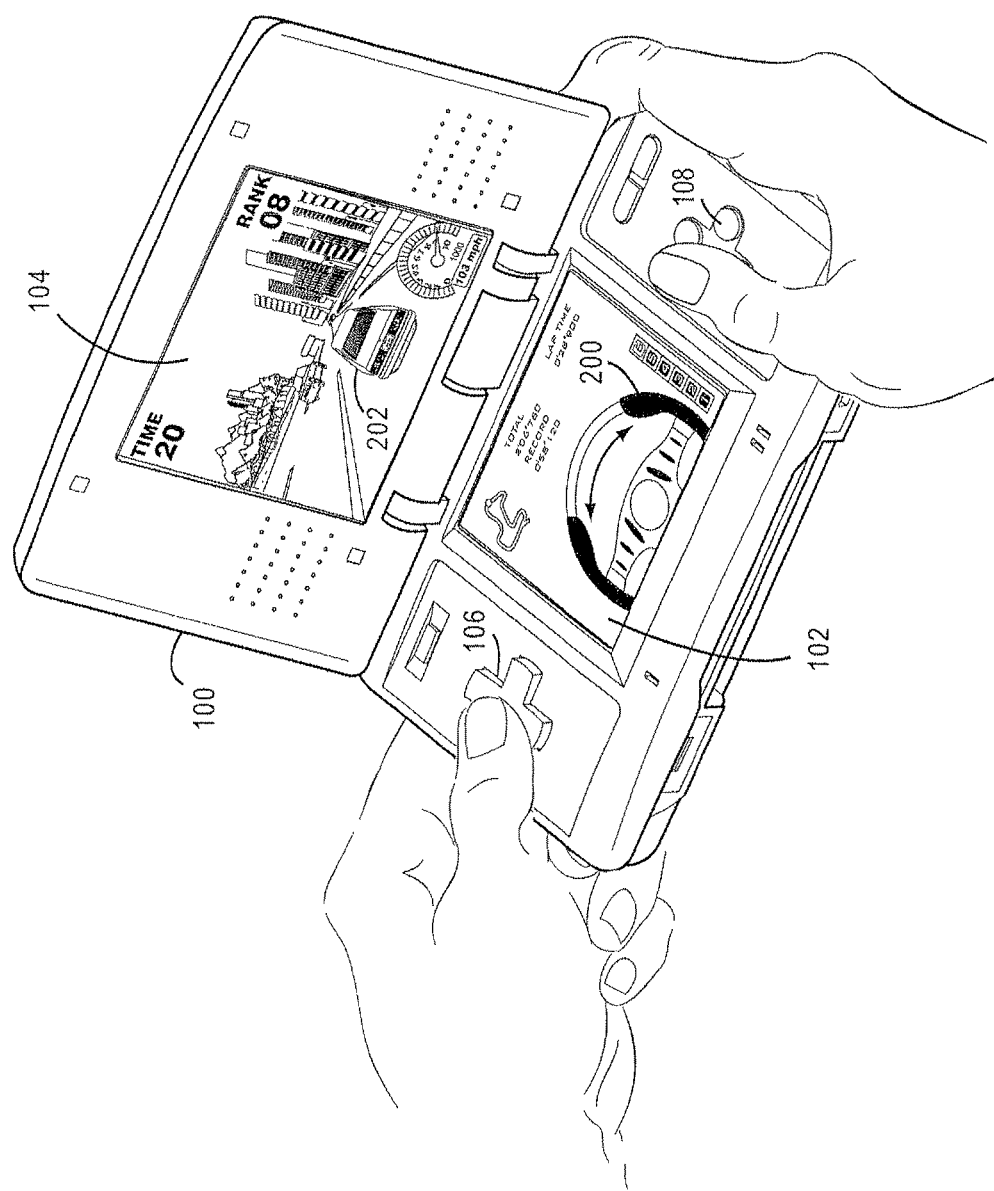
FIG. 1 is an exemplary illustrative non-limiting implementation of example vehicle simulation/game play using an exemplary illustrative non-limiting handheld video game platform including touch screen.

FIG. 1 shows an exemplary illustrative non-limiting implementation of a touch screen based handheld video game platform 100 that provides vehicle simulation such as for example a driving game. In the particular example show, handheld video game platform 100 may comprise for example a Nintendo DS video game system including dual screens 102, 104. In the example shown, the lower screen 102 provides a tough-sensitive surface. In this particular example, graphic 200 comprising the image of a steering wheel is displayed on the touch-sensitive screen 102. Steering wheel graphic 200 represents the steering wheel of a vehicle 202 and in this particular case is displayed on the upper screen 104. As will be understood by those skilled in the art, upper screen 104 may display the driver's view of the vehicle (i.e., as looking out of the vehicle's windshield from the driver's position), or it may display the third person view showing the vehicle's position as the vehicle travels down a path such as for example a racetrack.

In the exemplary illustrative non-limiting implementation shown, rotating the displayed steering wheel image 200 clockwise causes the simulated vehicle 202 to turn to the right. Similarly, rotating the displayed steering wheel image 200 counterclockwise causes the simulated vehicle 202 to steer to the left. The amount of steering wheel 200 rotation determines the amount of correction to the course that simulated vehicle 202 steers. Just as in a real motor vehicle, turning the steering wheel 200 more to the left causes the simulated vehicle 202 to steer more toward the left, while turning the steering wheel more to the right causes the simulated vehicle to steer more to the right.

In the exemplary illustrative non-limiting implementation, the user may apply different types of control inputs to specify the rotational orientation of displayed steering wheel 200. In the mode and configuration shown in FIG. 1, the user may depress a momentary on/off button 106 with his or her left thumb to cause the displayed steering wheel 200 to rotate counterclockwise. Similarly, the user may depress a momentary on button 108 with his or her right thumb to control displayed steering wheel 200 to rotate in a clockwise direction. In the example shown, depressing one of momentary on buttons 106, 108 for a longer period of time causes more rotation of displayed steering wheel 200. For example, depressing 106 for a very short period of time may cause displayed steering wheel 200 to rotate counterclockwise a small number of degrees, and then return to an initial neutral position. Depressing button 106 for a longer time period may cause displayed steering wheel 200 to rotate by a further angle counterclockwise. Holding the button 106 or 108 down may cause the displayed steering wheel 200 to rotate to a maximum clockwise or counterclockwise position and remain in that position until the button is released.

Release of both buttons 106, 108 may cause steering wheel 200 to rotate (at a predetermined rate) back to an initial and/or neutral position. In this way, using a simple momentary on-button depression, it is possible to provide a realistic simulated steering wheel control for a vehicle simulation such as a racing car, boat, spacecraft, aircraft, or any other type of vehicle.

Figure 1A:
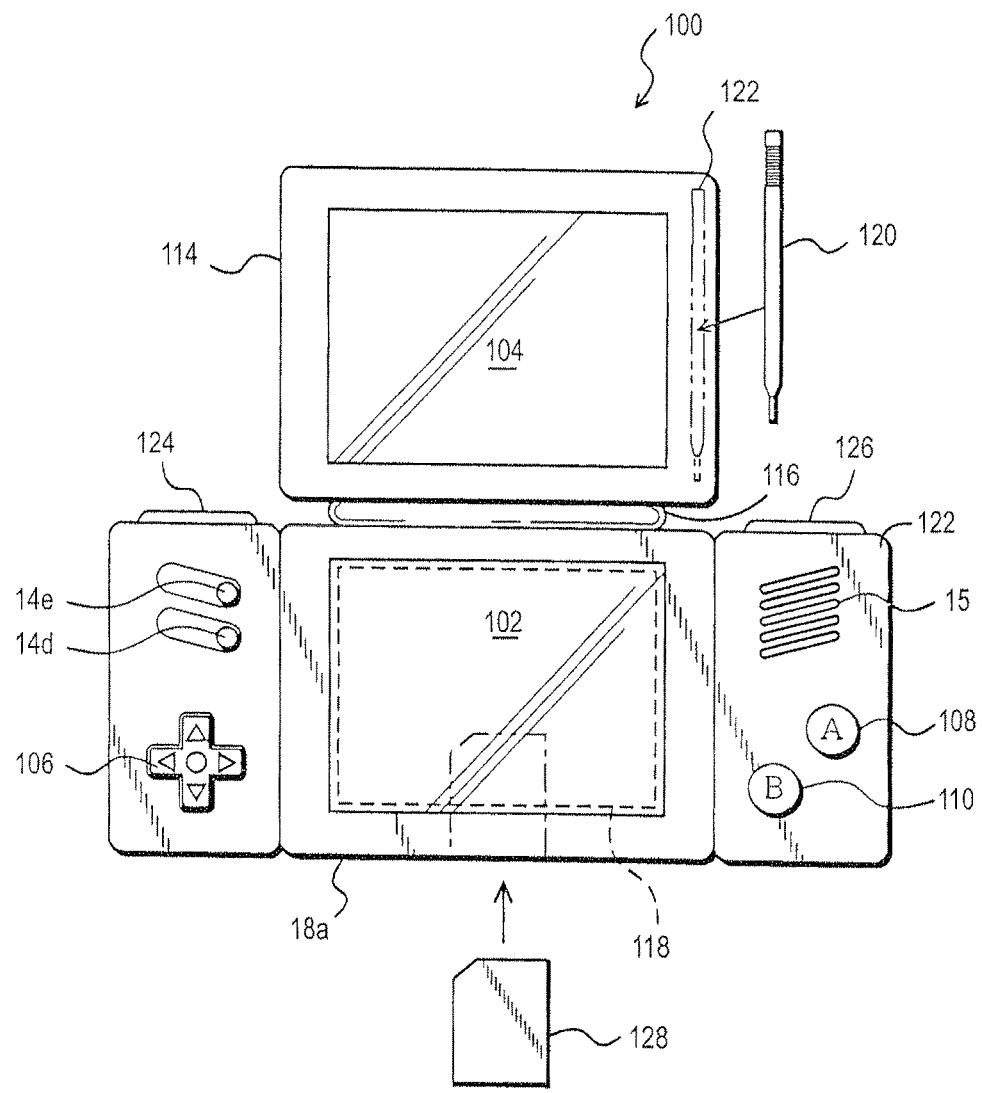
FIG. 1A shows a further illustrative view of the exemplary illustrative non-limiting video game play platform of FIG. 1.

FIG. 1A shows the exemplary illustrative non-limiting video game platform 100 in more detail. As shown in FIG. 1A, the lower, touch-sensitive screen 102 may be mounted on a lower housing portion 112, whereas an upper screen 104 may be mounted on an upper housing portion 114 that is attached to the lower housing portion by a hinge 116. The lower and upper screens 102, 104 may each comprise color liquid crystal displays. In the example shown, the lower screen 102 includes a touch-sensitive surface 118 that covers substantially the entire surface area of the lower screen. A stylus 120 (which may be stored when not in use within a stylus cavity 122 within the upper or lower housing 112, 114) may be used to provide touch inputs via touch-sensitive surface 118. Various input devices mounted on the lower housing 112 including previously-mentioned push button 106 (which may be a conventional cross-switch having four momentary on positions and one mutual off position), momentary on buttons 108, 110, buttons 124, 126 and other input devices may also be provided. Such buttons may be used to control steering wheel position (as explained above) as well as for controlling simulated acceleration, simulated brakes, and the like.

Figure 1B:
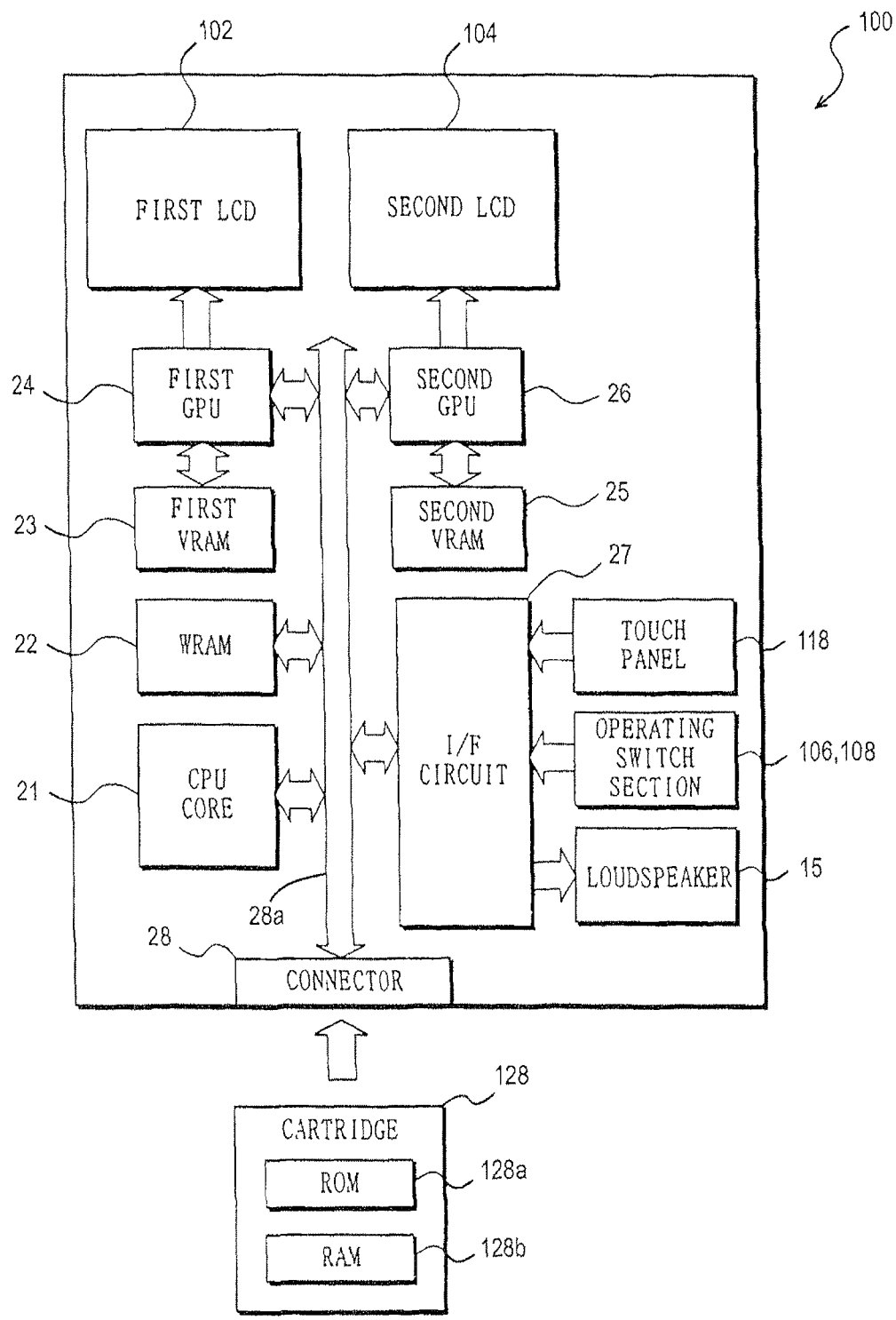
FIG. 1B shows a schematic block architectural diagram of the FIG. 1 exemplary illustrative non-limiting video game play platform.

The video game platform 100 shown in FIG. 1A may play a video game and provide corresponding interactive video game displays and audio based on contents of a memory card 128 that may be removably inserted into the video game platform 100. In more detail, referring to FIG. 1B, the memory cartridge 128 may include a read only memory 128a and a random access memory 128b. The read only memory 128a may store a variety of information including video game software to be executed by the video game platform 100. As further shown in FIG. 1B, the exemplary illustrative non-limiting video game platform 100 may include first and second graphics processing units 24, 26 coupled to corresponding video RAMS 23, 25, respectively. A CPU core 21 may access the contents of cartridge 128 via a connector 28 and a bus 28a. CPU core 21 reads video game instructions and other information from the cartridge 128, and controls the graphics processors 24, 26 to display resulting video game images on liquid crystal displays 102, 104. Inputs provided by touch panel 118, operating switches 106, 108 and other inputs are provided to CPU core 21 via an interface circuit 27. Audio can also be played back via a loudspeaker 15.

Figure 2:
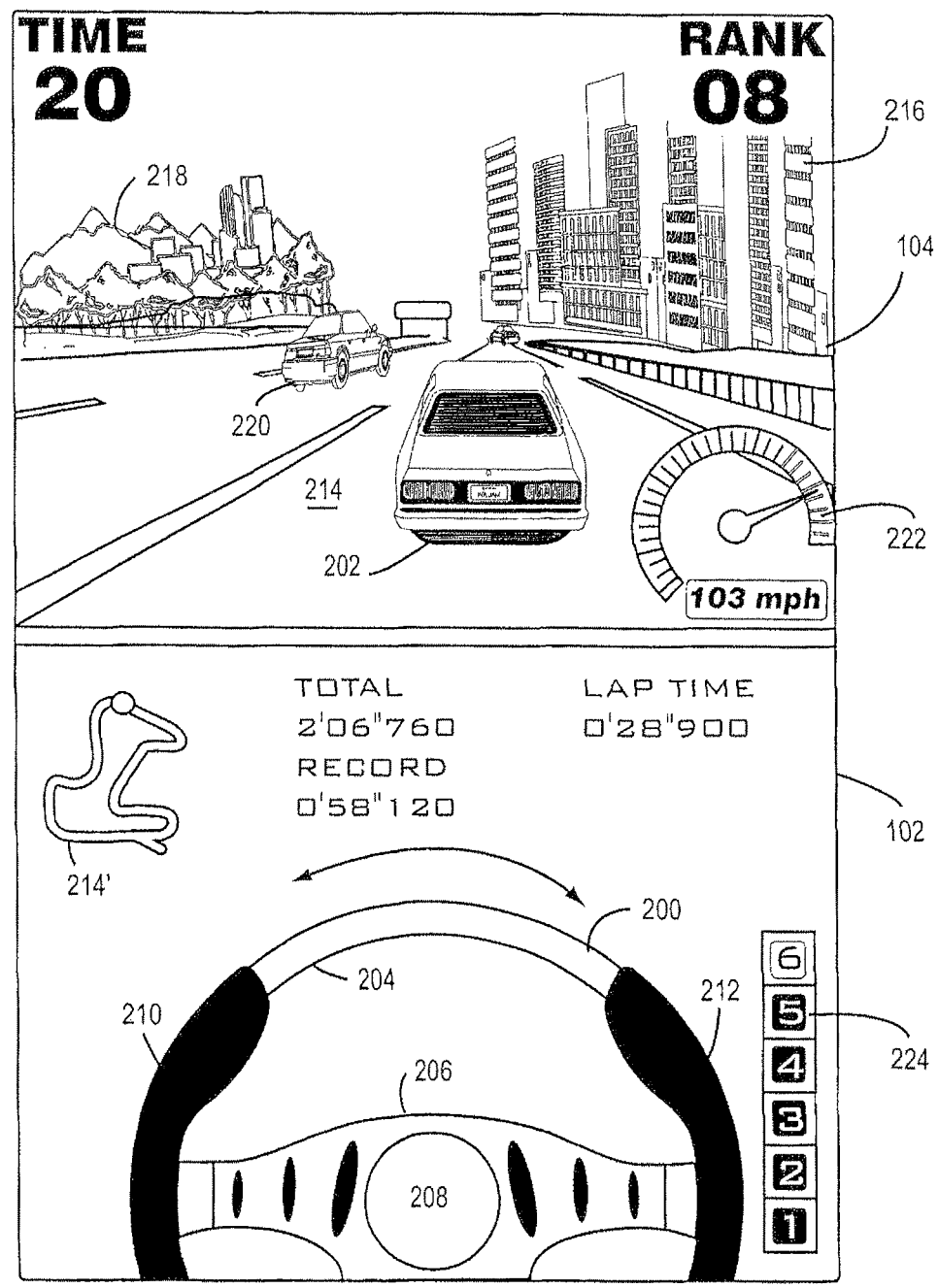
FIG. 2 shows more detailed view of exemplary top and bottom screen displays of FIG. 1.

FIG. 2 shows in more detail the exemplary illustrative non-limiting screen 102, 104 displays shown in FIG. 1. As shown in FIG. 2, lower screen 102 displays graphical image 200 of the steering wheel. The steering wheel image 200 shown includes a conventional circular rim portion 204 and an inner hub portion 206. A button 208 at the center of the hub portion 206 may represent a conventional vehicle horn button. Grip areas 210, 212, are provided to resemble portions of a steering wheel that are typically gripped by the driver's hands. In the exemplary illustrative non-limiting implementation shown, user input controls the displayed steering wheel 200 to rotate clockwise or counterclockwise by a controllable amount. Also displayed on display screens 102, 104 is a variety of other interesting interactive graphics. For example, FIG. 2 shows an image of a race car or other vehicle 202 navigating a track 214. The track may pass through a three-dimensional landscape such as buildings 216, mountains 218 and the like. Other vehicles 220 may be displayed on the track, and the object of the game may be to maneuver simulated vehicle 202 as rapidly as possible down track 214 in order to win a race against other simulated vehicles 220. Virtual speedometer 222 may be displayed to show the speed at which the simulated vehicle 202 is traveling down the track. The simulated gear shift display 224 may be displayed showing the transmission gear that the simulated vehicle is operated in. An image of track 214 as if viewed from an airplane or satellite may be displayed to inform the user of the position of simulated vehicle 202 on the track. Various other informational displays may be provided showing lap number, lap time, lap record and the like.

Figure 2A:
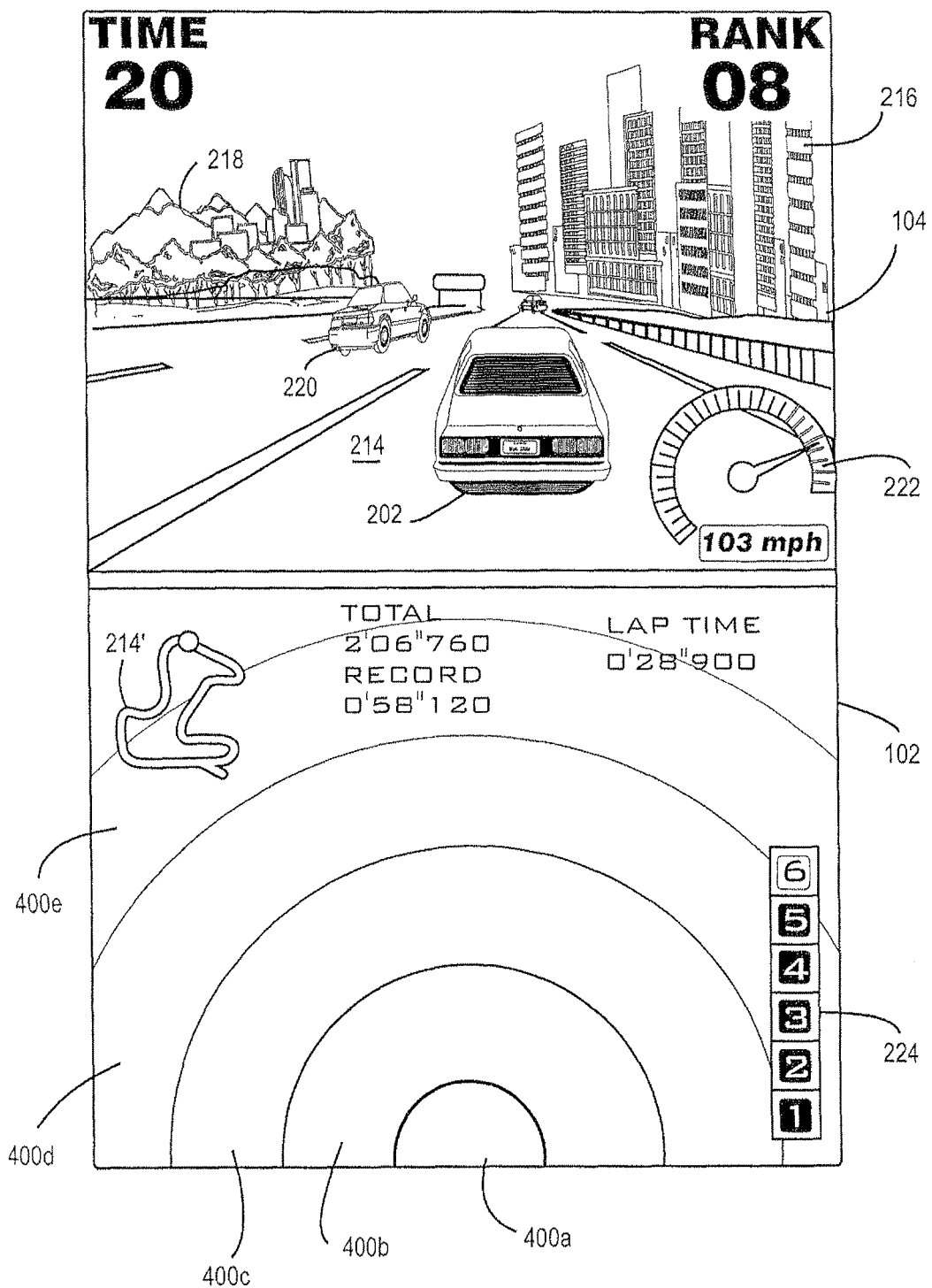
FIG. 2A shows an example alternative view of exemplary top and bottom screen displays in which the steering wheel view of FIG. 2 is replaced with a zone pattern.

FIG. 2A shows an exemplary illustrative non-limiting variation of the FIG. 2 display in which the steering wheel graphic 200 is replaced with a series of zones 400a-400e. In the particular example shown, zones 400a-400e may comprise concentric circular regions such as the top half of an archery target. These zones 400a-400e may for example define different sensitivity levels for touch provided within the zones. For example, a given change in touch position within the center zone 400a may extert greater change to the path of simulated vehicle 202, whereas this same given change in touch position within an outer zone 400d may extert less change to the vehicle's path.

Figure 3A:
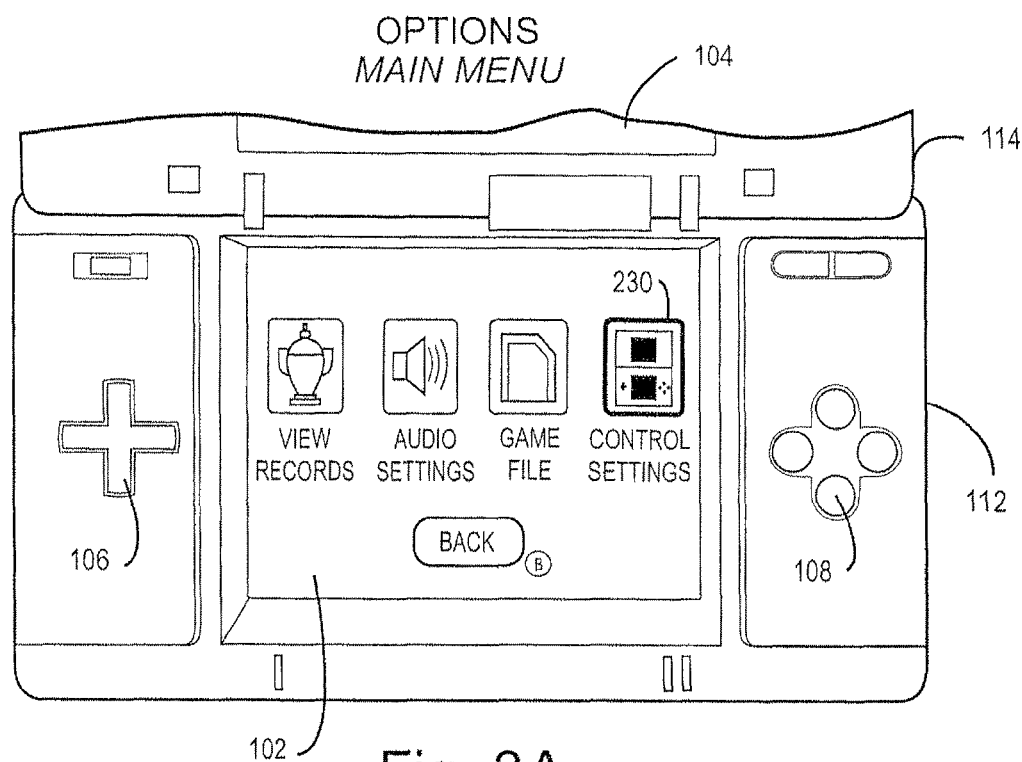
FIGS. 3A and 3B show exemplary illustrative non-limiting control settings/input mode selection.
Figure 3B:
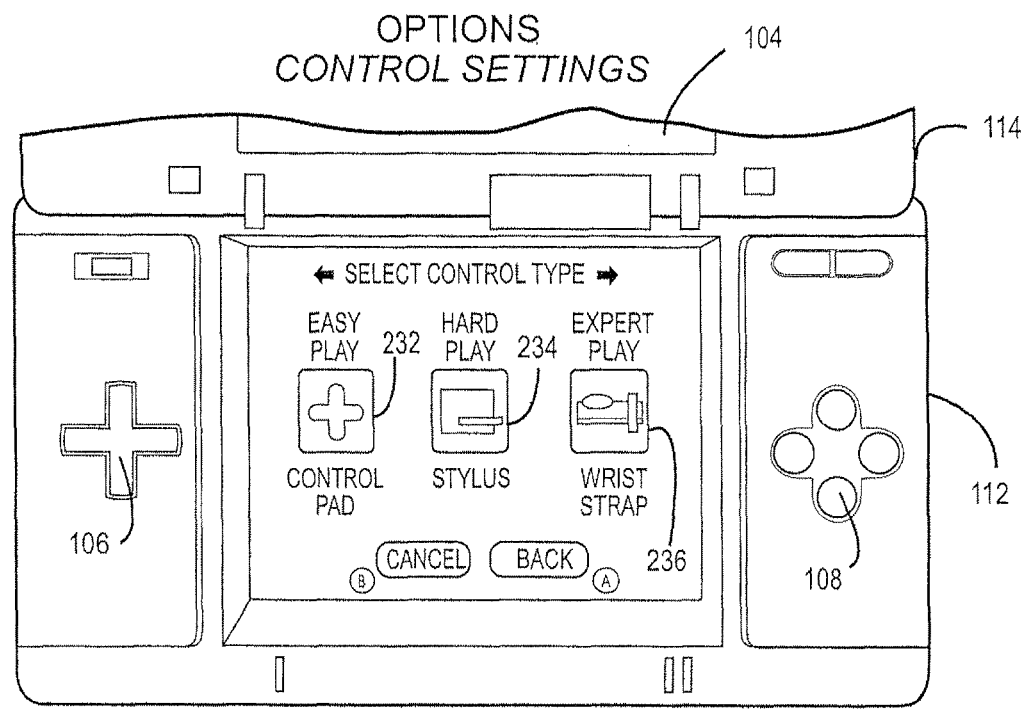

In the exemplary illustrative non-limiting implementation shown, the user may select different input modes for controlling and/or selecting the input controls used to determine and control the rotational orientation of displayed steering wheel 200. As shown in FIG. 3A, an initial screen may display a variety of options including control settings 230. Selecting the control settings option 230 may allow the user to select between three different control input modes:

control pad mode 232,
stylus mode 234,
wrist strap mode 236.

In the example shown, a control pad mode operates as described in connection with FIG. 1—that is depressing the momentary on buttons 106, 108 causes the displayed steering wheel image 200 to rotate clockwise and counterclockwise. The stylus mode 234 is used when the user wishes to control the orientation of displayed steering wheel 200 using the stylus 120 and touch-screen 118. The user can select a wrist strap mode 236 to allow the user to control the orientation of displayed steering wheel 200 using a thumb-mounted nib that the user moves in contact with touch-sensitive screen 118.

Figure 4A:
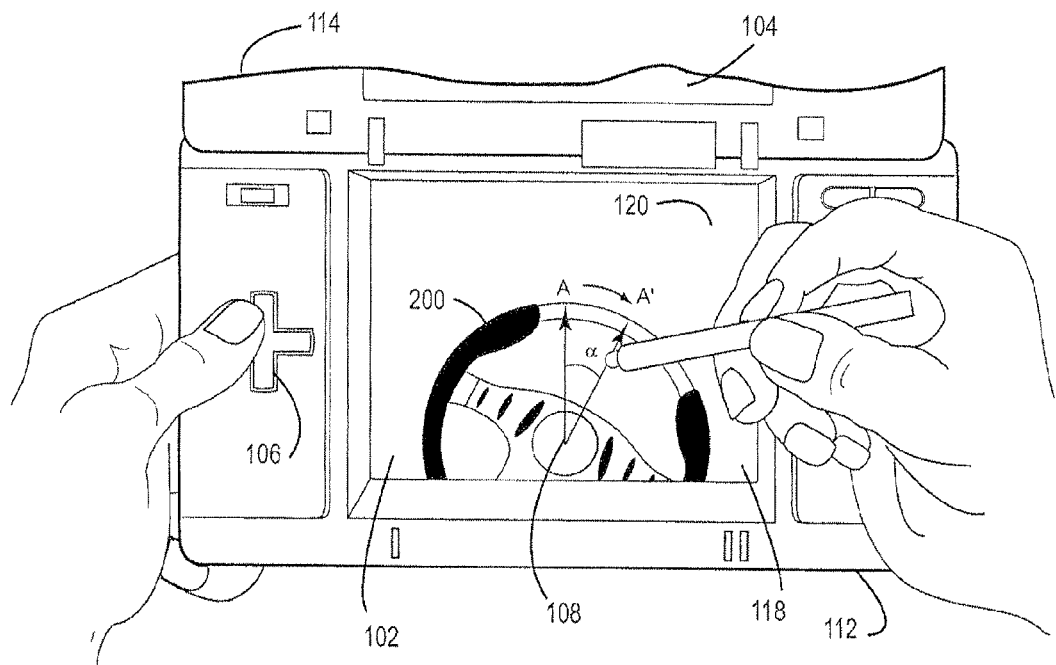
FIGS. 4A and 4B show exemplary user input control using a stylus.

As shown in FIG. 4A, in the stylus mode 234, the user may use stylus 120 in contact with touch-sensitive screen 118 to control the rotational orientation of the displayed steering wheel 200. The technology herein provides a method for implementing a steering-wheel simulator for a touch-panel device. This idea has proven very effective in a video-game environment. This implementation has been tested on an LCD-based touch-panel device 100. Three exemplary illustrative sections are provided in an exemplary illustrative non-limiting implementation:

(a) A graphic 200 of a steering-wheel is drawn on the LCD display 102. The input from the stylus 120 is used to determine a vector from the center 208 of the steering-wheel 200 to the point being touched on the LCD display 102. The angle between any two consecutive vectors is used to determine the direction and amount of rotation of the steering-wheel.

(b) While the input from the steering-wheel itself is sufficient to simulate, for example, the driving of an automobile, the input is further analyzed to make the simulated vehicle more controllable for the user. Specific zones are defined (centered around the wheel at approximately 45-degrees from center in either direction). See FIG. 5. The user input is constantly compared to these zones to determine exactly how "frantic" the user is responding to the current position and orientation of the simulated vehicle. This allows the simulation to actually "take-over" (for short periods of time) when it deems it appropriate to keep the vehicle centered on the road.

(c) As the simulation progresses, the user is given visual-feedback (via translation and scaling of the steering-wheel graphic 200) about the current environment that the vehicle is experiencing. See FIGS. 7A and 7B. This may include collisions with other cars or static objects, rough-road, etc. This feedback allows the user to have a much more vivid experience in the simulation than merely seeing other cars or objects close to his or her vehicle.

Figure 4B:
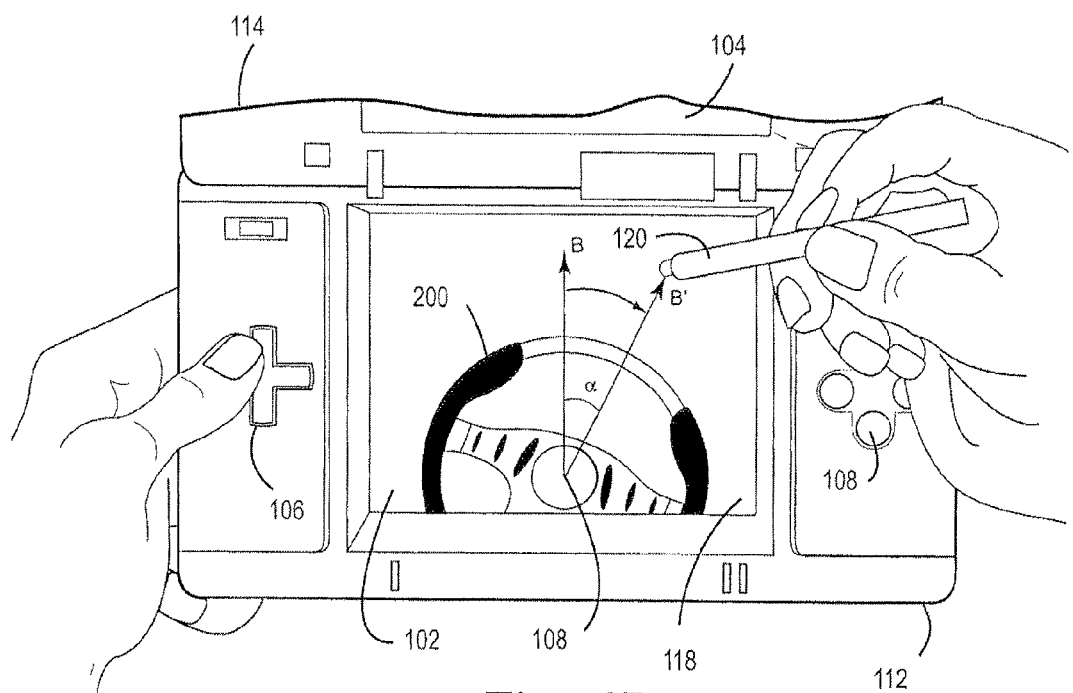

In more detail, referring to FIGS. 4A and 4B, in an example illustrative non-limiting implementation, starting and ending positions of stylus 120 can be sensed by touch screen 118 and used to define starting and ending vectors A, A' or B, B'. The angle α between initial and final vectors may be used to determine the amount of rotation of steering wheel 200. The larger the angle α, the more the steering wheel 200 rotates. Note that in this example, the further away stylus 120 is placed from the center 208 of steering wheel 200, the more linear motion of the stylus 120 is required to rotate the steering wheel 200 by a given amount. For example, when the stylus 120 is placed directly onto the image of steering wheel 200, it is relatively close to the center 208 of the steering wheel and so therefore a relatively small displacement between beginning and ending stylus points needed to rotate the steering wheel by a given angle α. In contrast, as shown in FIG. 4B, when the stylus 120 position is relatively far away from the center 208 of steering wheel 200, the stylus needs to be moved a relatively far amount to achieve the same rotation angle α of steering wheel 200.

This exemplary illustrative functionality allows the user to flexibly determine the amount of control (finer or coarse) over the orientation of steering wheel 200 by simply locating stylus 120 relative to the center 208 of steering wheel 200. The further away the user places the tip of stylus 120 from the center 208 of the steering wheel 200, the more the user needs to move the stylus tip to achieve the same amount of steering wheel rotation. The user does not need to place the tip of the stylus 120 directly on the steering wheel 200 to move the steering wheel—placing the stylus anywhere on the touch screen 118 in the exemplary illustrative non-limiting implementation is sufficient to effect rotation of the steering wheel 200. The ability that a user has to select the proportionality between the amount of movement of the stylus 120 tip and amount of rotation of steering wheel 200 depending upon the distance of the stylus tip relative to the steering wheel center 208 gives users ergonomic choices to match their skill level, hand to eye coordination skills and other ergonomic affects. Note also that in the exemplary illustrative non-limiting implementation, it is not necessary for stylus 120 tip to be moved arcuately in order to effect rotation of steering wheel 200. The user may move the tip of stylus 120 in an entirely linear fashion or along any convenient path in any desired direction and the exemplary illustrative non-limiting implementation will detect such movement, automatically define a vector from the center 208 of the steering wheel to the current stylus position, and effect rotation of steering wheel 200 accordingly.

It should be understood that the display of steering wheel 200 is not essential to the control of the game. Display of a graphic of steering wheel 200 is in some contexts very convenient in that it gives the user an immediate intuitive understanding of the different ways in which different touch screen inputs steer the simulated vehicle 202. However, players often find that once they understand this steering phenomenon and functionality, they stop looking at the displayed steering wheel 200 and concentrate their view of the simulated vehicle 202. This is especially true when the player controls the simulated vehicle 202 to travel down the track at high simulated speed (e.g., over 100 miles per hour). In such high speed operation, the player's eye may be extremely focused on the horizon of the top screen 104 and the player may cease looking at steering wheel 100 altogether or he or she may only see the simulated steering wheel from peripheral vision. In such instances, it may sometimes be desirable to replace the view of steering wheel 100 with some other view or to allow the user to select a different view.

As illustrated in FIG. 5, exemplary illustrative non-limiting implementations may define different zones on touch screen 118. For example, FIG. 5 shows four zones: "zone 1," "zone 2", "zone 3" and "zone 4." The illustrated zone 1 and zone 4 may be defined as "frantic" zones in the sense that when a user's stylus has entered those zones, it is likely that the user is not very skilled and is trying to exert too much correction or too rapid correction of the steering wheel 200 orientation to be successful in playing the vehicle simulation. While realism is generally desired in vehicle simulation and driving games, it is also important in general for video game play to be fun. Therefore, in the exemplary illustrative non-limiting implementation upon detection that the stylus input has entered zone 1 or zone 4 shown in FIG. 5 may exert an additional "assist" force that in part saves the user from the consequences of his or her over steering. In this exemplary illustrative non-limiting implementation, this active assist may, for example, prevent the simulated vehicle 202 from leaving the track even though the extreme amount of steering correction the user effects by placing the stylus in zone 1 or zone 4 would immediately cause the vehicle to crash. Such assist functions can make game play more fun and rewarding for inexperienced users while generally not effecting game play of more experienced users who will generally not attempt to over steer by causing their stylus 120 to enter zone 1 or zone 4. The amount of assist can be carefully selected to permit experienced players to rapidly control the course of vehicle 202 while saving less experienced players from frustrating crashes and accidents.

FIG. 6 shows an additional exemplary illustrative non-limiting user input mode 236 that uses a wrist strap-based wearable touch screen actuator. In the example shown, a wrist strap 280 attached to the lower housing 112 and generally used to carry the platform 100 in a suspended manner from the user's wrist when not in use may provide a thumb loop 282 attached to which is a thumb nib 284 (see FIG. 6A). The user can insert his thumb into the thumb loop 282 and use the thumb nib 284 in contact with touch screen 118 to provide the touch input for controlling the steering wheel 200 orientation. In the example shown, the user may but need not place the thumb nib 204 in direct contact with the steering wheel 200 image. In this mode, the exemplary illustrative non-limiting implementation scales the amount of input with placement of the thumb nib relative to stylus motion 120 so that a smaller amount of thumb movement accomplishes the same rotational orientation effect on steering wheel 200 as a larger amount of stylus 120 motion. Exemplary illustrative non-limiting implementation performs this scaling because most users will not move their thumbs as much as they will move a stylus 120. The same sort of vector control shown in FIGS. 4A and 4B may be applied to the wrist strap-based control input mode 236, or alternatively, scaling may be provided so the same amount of steering wheel 200 orientation change may be effected for a given displacement of the thumb nib 284 on touch screen 118 irrespective of the starting and ending positions of the thumb nib relative to steering wheel center 208.

Figure 7A:
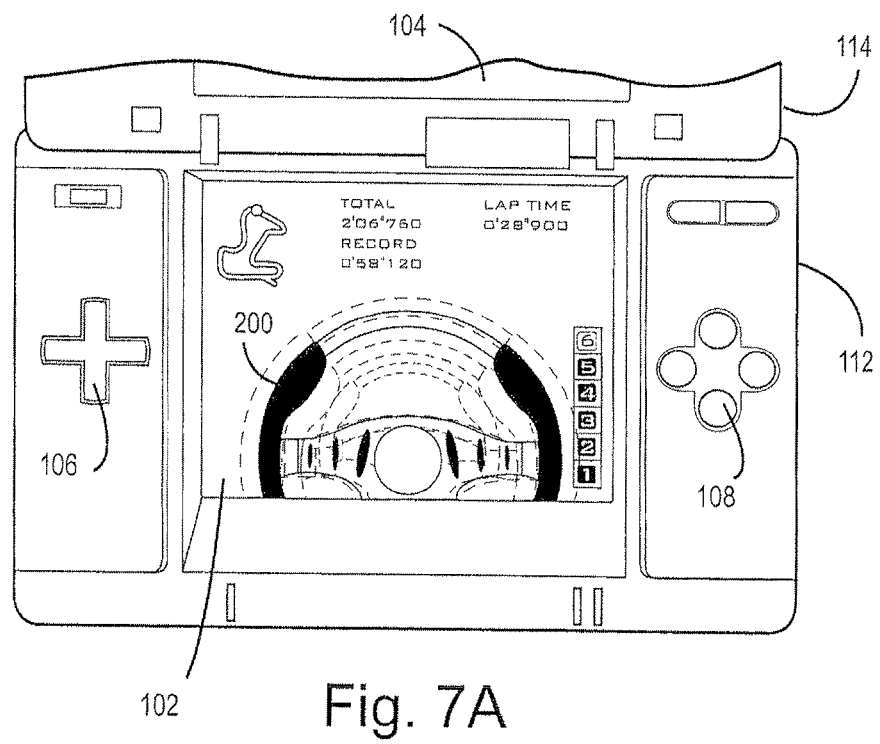
FIGS. 7A and 7B show exemplary illustrative non-limiting visual effects.
Figure 7B:
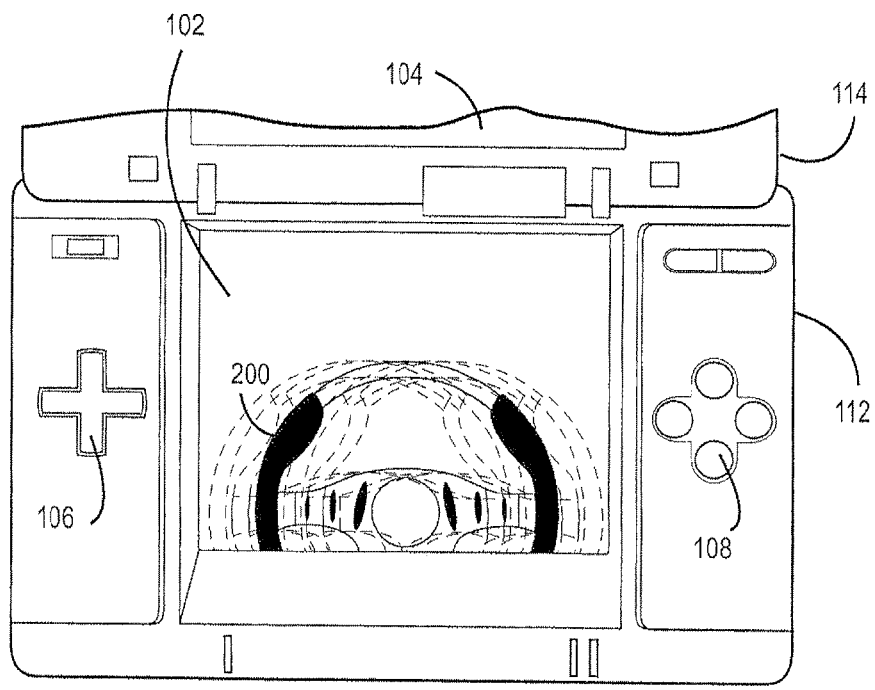

FIGS. 7A and 7B show example additional visual effects indicating collisions with virtual objects, passage over steep cliffs or speed bumps or other obstacles, etc. As shown in FIGS. 7A and 7B, the image of steering wheel 200 may appear to vibrate (e.g., become smaller and larger in an alternating fashion or moving from side to side) to provide additional realism. The effect is somewhat similar to what a race car driver would see as his head and body vibrated or moved relative to the position of the steering wheel when passing over speed bumps or other obstacles.

Figure 8:
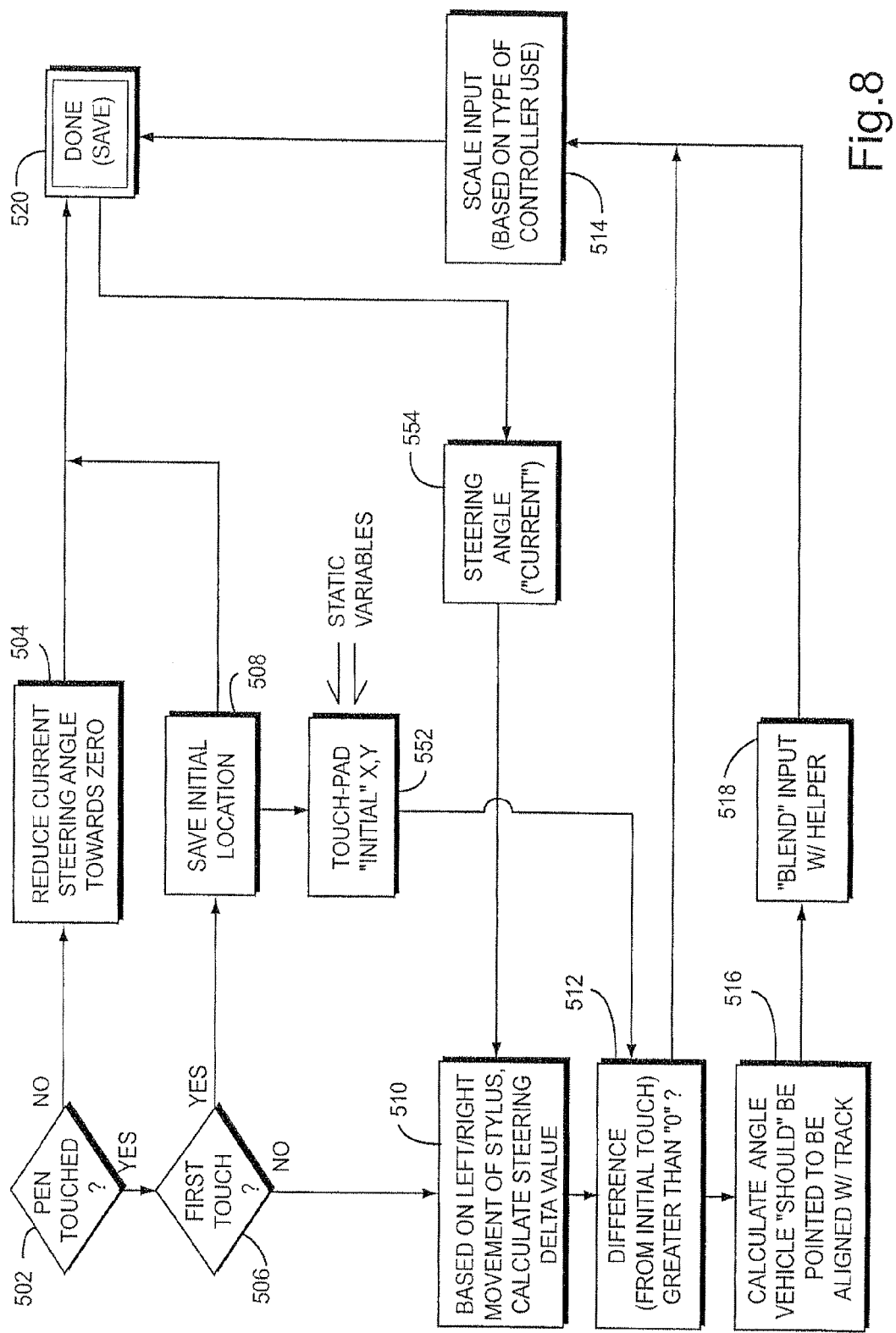
FIG. 8 shows a flowchart of an exemplary illustrative non-limiting steering-control routine.

The flowchart of the exemplary illustrative non-limiting steering-control routine shown in FIG. 8 takes input from the touch-panel 118 by examining the changes in input from one frame to the next. Touch is sensed (block 502). The initial point of contact ("touch") is saved (blocks 506, 508) in a touch pad initial position register (block 552) and used as the "center" for all future steering calculations. Each time the user lifts the stylus 120 from the screen 118, the "virtual steering wheel" 200 is centered (block 504). Such recentering can take place over time at a predetermined rate of reducing current steering angle toward zero. Each new touch determines a new center for the steering-input (block 510, 512). Any dragging of the stylus 120 to the left or right is scaled (block 514) and passed on to the functions described below. This scaling is done for two reasons: (1) it allows the designer to adjust the feel of the steering input to suit the simulation, and (2) it allows different types of styluses 120 to be supported—some of which do not have the range of movement that a typical "pen" device might have (e.g. a "thumb-pad" 284 is limited in range by the user's thumb and, therefore, has a much larger scaling-factor applied to it. Most users simply cannot move it as far to the left or right as a pen).

At any point along the track 214, the steering-control routine can determine the angle that the car 202 should be pointed in order to be oriented directly along the road (block 516). It then uses this angle—along with the current orientation of the player's car 202—to determine a "helper" adjustment angle that can be scaled and applied to (blended with) the current user input (block 518). This allows the player to feel as though he or she is driving the car 202 by moving a stylus left and right on the touch-pad but still not require precise inputs to keep the simulation fun. Note that in the exemplary illustrative non-limiting implementation described, the scaling-factor (amount of scaling) is very important and must be determined by repeated play-testing. Too little scaling requires the user to make too many small adjustments, too much scaling masks any user input and makes the simulation "automatic" and not much fun!

The "helper" adjustment is not applied to the user's input at all times. When the player makes an extreme input (i.e. move the stylus 120 more than one-half of the screen width), the "helper" function is disabled completely and only the user's "real" input is used. This allows the player to turn the car sharply to the left or right as required by the game. This particular exemplary illustrative non-limiting application implements a "drift-mode" that allows the player to slide around corners in a similar fashion to real auto racing. This move would not be possible if the car 202 were kept oriented along the direction of the track.

While the technology herein has been described in connection with exemplary illustrative non-limiting embodiments, the invention is not to be limited by the disclosure. For example, although a race simulation is shown, the input may be used to control any sort of vehicle or object or any other simulation or game input parameter. While a simulated steering wheel 200 has been described for purpose of illustration, other simulated input devices (e.g., joy sticks, control levers, etc.) may be displayed and controlled instead or in addition, or display of the steering wheel can be eliminated. The invention is intended to be defined by the claims and to cover all corresponding and equivalent arrangements whether or not specifically disclosed herein.

We claim:

1. Apparatus comprising:
   a touch screen display having a touch surface, the touch screen display configured to output touch coordinates representing movement of an input object on the touch surface,
   non-volatile memory configured to store instructions, and
   a processor operatively coupled to the touch screen display and the non-volatile memory, the processor executing the stored instructions to:
   (a) display an object on the touch screen display,
   (b) detect plural touch coordinates indicating linear movement of the input object on the touch surface at a position on the touch screen display that does not need to be in registry with the displayed object, and
   (c) animate the displayed object to rotate by an amount corresponding to a length of the detected linear movement.

2. Apparatus of claim 1 wherein the processor animates the displayed object to rotate counterclockwise in response to detected right-to-left linear movement, and animates the displayed object to rotate clockwise in response to detected left-to-right linear movement.

3. Apparatus of claim 1 wherein the processor scales the amount of rotation based on relative position of the input object relative to a reference point on the display.

4. Apparatus of claim 3 wherein the reference point comprises an imaginary vertical center of the display.

5. Apparatus of claim 1 wherein the input object comprises at least one of a finger and a tool.

6. Apparatus of claim 5 wherein the tool comprises a stylus.

7. Apparatus of claim 5 wherein the tool is worn by a user.

8. Apparatus of claim 1 wherein the processor determines a zone on the touch screen display of input object movement, and selectively exerts a degree of autonomous control over the animated displayed object depending on the determined zone.

9. Apparatus of claim 1 wherein the processor continually determines where the input object is moving on the touch surface relative to where the animated object is displayed on the touch screen display to infer how frantically a user is responding to the current position and orientation of the displayed object, and takes over animated control of the displayed object for short periods of time in response to inferred franticness when the processor determines it is appropriate to maintain control of the animated object.

10. Apparatus comprising:
a touch screen display configured to output touch coordinates representing location of an input object in contact therewith,
non-volatile memory configured to store instructions, and
a processor operatively coupled to the touch screen display and the non-volatile memory, the processor executing the stored instructions to:
   (a) display a virtual object at a known location on the touch screen display,
   (b) detect a sequence of outputted touch coordinates;
   (c) determine from the detected sequence of outputted touch coordinates the location(s) of the input object on the touch screen display and how far and in what direction the input object moved; and
   (d) in response to the determining, animating the displayed virtual object to rotate by an amount corresponding to how far the input object moved and in a direction determined by the direction of input object movement even when the detected location of the input object does not coincide the known location and even when the input object movement is substantially linear.

11. Apparatus comprising:
a touch screen display having a touch surface, the touch screen display configured to output touch coordinates representing movement of an input object on the touch surface,
non-volatile memory configured to store instructions, and
a processor operatively coupled to the touch screen display and the non-volatile memory, the processor executing the stored instructions to:
   (a) detect plural touch coordinates indicating movement of the input object on the touch surface,
   (b) control steering of a vehicle by an amount corresponding to a length of the detected movement and in a direction corresponding to direction of the detected movement;
   (c) infers how frantically a user is responding to the current position and orientation of vehicle based on where the input object is moving on the touch surface; and
   (d) selectively takes over control of steering of the vehicle for short periods of time in response to the inferred degree of user franticness.

12. Apparatus of claim 11 wherein the processor controls the vehicle to steer counterclockwise in response to detected right-to-left movement of the input object, and controls the vehicle to steer clockwise in response to detected left-to-right movement of the input object.

13. Apparatus of claim 1 wherein each of the plural touch coordinates indicates position on the touch surface in two orthogonal dimensions.

14. Apparatus of claim 10 wherein each of the outputted sequence of touch coordinates indicates position on the touch screen in two orthogonal dimensions.

15. Apparatus of claim 11 wherein the touch screen display is further configured to output the touch coordinates indicating position on the touch surface in two orthogonal dimensions.

* * * * *